(12) United States Patent
Bedell et al.

(10) Patent No.: US 6,841,457 B2
(45) Date of Patent: Jan. 11, 2005

(54) USE OF HYDROGEN IMPLANTATION TO IMPROVE MATERIAL PROPERTIES OF SILICON-GERMANIUM-ON-INSULATOR MATERIAL MADE BY THERMAL DIFFUSION

(75) Inventors: Stephen W. Bedell, Wappingers Falls, NY (US); Keith E. Fogel, Mohegan Lake, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 10/196,611

(22) Filed: Jul. 16, 2002

(65) Prior Publication Data

US 2004/0012075 A1 Jan. 22, 2004

(51) Int. Cl.[7] .......................... H01L 21/20; H01L 21/36
(52) U.S. Cl. ...................... 438/479; 438/311; 438/341; 438/478; 438/933
(58) Field of Search ................................ 438/311, 341, 438/413, 478, 479, 481, 607, 933

(56) References Cited

U.S. PATENT DOCUMENTS

| | | | | |
|---|---|---|---|---|
| 6,524,935 B1 | * | 2/2003 | Canaperi et al. | ............ 438/478 |
| 6,555,839 B2 | * | 4/2003 | Fitzgerald | .................... 257/18 |
| 6,573,126 B2 | * | 6/2003 | Cheng et al. | ................ 438/149 |
| 6,593,191 B2 | * | 7/2003 | Fitzgerald | ................... 438/282 |
| 6,593,641 B1 | * | 7/2003 | Fitzergald | .................... 257/616 |
| 6,607,948 B1 | * | 8/2003 | Sugiyama et al. | ........... 438/151 |
| 6,649,480 B2 | * | 11/2003 | Fitzgerald et al. | ........... 438/285 |
| 6,689,211 B1 | * | 2/2004 | Wu et al. | ....................... 117/94 |
| 6,703,144 B2 | * | 3/2004 | Fitzgerald | .................... 428/641 |
| 6,713,326 B2 | * | 3/2004 | Cheng et al. | ............... 438/149 |
| 6,724,008 B2 | * | 4/2004 | Fitzergald | ..................... 257/19 |
| 6,730,551 B2 | * | 5/2004 | Lee et al. | .................... 438/191 |
| 2003/0199153 A1 | * | 10/2003 | Kovacic et al. | ............. 438/479 |

* cited by examiner

Primary Examiner—John F. Niebling
Assistant Examiner—Stanetta Isaac
(74) Attorney, Agent, or Firm—Scully, Scott, Murphy & Presser; Robert M. Trepp, Esq.

(57) ABSTRACT

A method of forming a relaxed SiGe-on-insulator substrate having enhanced relaxation, significantly lower defect density and improved surface quality is provided. The method includes forming a SiGe alloy layer on a surface of a first single crystal Si layer. The first single crystal Si layer has an interface with an underlying barrier layer that is resistant to Ge diffusion. Next, ions that are capable of forming defects that allow mechanical decoupling at or near said interface are implanted into the structure and thereafter the structure including the implanted ions is subjected to a heating step which permits interdiffusion of Ge throughout the first single crystal Si layer and the SiGe layer to form a substantially relaxed, single crystal and homogeneous SiGe layer atop the barrier layer. SiGe-on-insulator substrates having the improved properties as well as heterostructures containing the same are also provided.

29 Claims, 6 Drawing Sheets

USE OF HYDROGEN IMPLANTATION TO IMPROVE MATERIAL PROPERTIES OF SILICON-GERMANIUM-ON-INSULATOR MATERIAL MADE BY THERMAL DIFFUSION

RELATED APPLICATIONS

This application is related to co-pending and co-assigned U.S. patent application Ser. No. 10/055,138, filed Jan. 23, 2002, the entire content of which is incorporated herein by reference.

FIELD OF THE INVENTION

The present invention relates to a method of fabricating a semiconductor substrate material, and more particularly to a method of fabricating thin, high-quality, substantially relaxed SiGe-on-insulator (SGOI) substrate materials. Specifically, the method of the present invention provides an improved SGOI substrate material that has an increased degree of relaxation, minimized surface artifacts and a reduced density of crystal defects as compared to prior art SGOI substrate materials. The present invention is also directed to a SGOI substrate material having the above-mentioned properties as well as structures which include at least the inventive SGOI substrate material.

BACKGROUND OF THE INVENTION

In the semiconductor industry, there has recently been a high-level of activity using strained Si-based heterostructures to achieve high carrier mobility structures for CMOS applications. Traditionally, to boast performance of NFET and PFET devices, the prior art method to implement this has been to grow strained Si layers on thick (on the order of from about 1 to about 5 micrometers) relaxed SiGe buffer layers.

Despite the high channel electron mobilities reported for prior art heterostructures; the use of thick SiGe buffer layers has several noticeable disadvantages associated therewith. First, thick SiGe buffer layers are not typically easy to integrate with existing Si-based CMOS technology. Second, the defect densities, including threading dislocations (TDs) and misfit dislocations, are from about $10^6$ to about $10^8$ defects/cm$^2$ which are still too high for realistic VLSI (very large scale integration) applications. Thirdly, the nature of the prior art structure precludes selective growth of the SiGe buffer layer so that circuits employing devices with strained Si, unstrained Si and SiGe materials are difficult, and in some instances, nearly impossible to integrate.

In order to produce relaxed SiGe material on a Si substrate, prior art methods typically grow a uniform, graded or stepped, SiGe layer to beyond the metastable critical thickness (i.e., the thickness beyond which dislocations form to relieve stress) and allow misfit dislocations to form, with the associated threading dislocations, through the SiGe buffer layer. Various buffer structures have been used in an attempt to increase the length of the misfit dislocation section in the structures and thereby to decrease the TD density.

When a typical prior art metastable strained SiGe layer is annealed at a sufficiently high temperature, misfit dislocations will form and grow thereby relieving the total strain on the film. In other words, the initial elastic strain of the film is relieved by the onset of plastic deformation of the crystal lattice. For the case of prior art metastable strained SiGe grown on SOI substrates, experiments have shown that under most annealing/oxidation conditions, the formation of misfit dislocations occurs early in the annealing history for temperatures greater than ~700° C. Many of these defects are then either consumed or annihilated during the high-temperature annealing of the structure, however, the surface topography of the original misfit array persists during oxidation. Furthermore, SGOI substrate materials fabricated by thermal diffusion do not completely relax the SiGe alloy layer. Instead, the final SiGe lattice expands only to some fraction of the equilibrium value.

If the Si layer in the initial SOI substrate were truly allowed to "float" with respect to the buried oxide (BOX) layer, then the initial strain in the metastable SiGe/Si bilayer structure could be relieved elastically by sliding along the Si/buried oxide boundary (i.e., elastic relaxation). Although it has been conjectured that this happens naturally at the Si/BOX interface (at a sufficiently high temperature), thorough investigation of this idea has shown that this does not happen (at the macroscopic scale) and misfit arrays form when annealing initially metastable bilayer films.

In view of the problems mentioned with prior art processes of fabricating SGOI substrate materials, there is a continued need for providing a new and improved method that allows for the enhanced low-temperature elastic relaxation of metastable SiGe alloys grown on SOI substrates.

SUMMARY OF THE INVENTION

One object of the present invention is to provide a method of fabricating a thin, high-quality SGOI substrate material.

Another object of the present invention is to provide a method of fabricating a thin, high-quality SGOI substrate material that has a substantially high degree of lattice relaxation associated therewith.

A further object of the present invention is to provide a method of fabricating a thin, high-quality SGOI substrate material that has substantially little or no surface artifacts, i.e., defects, associated therewith.

A yet further object of the present invention is to provide a method of fabricating a thin, high-quality SGOI substrate material that has a significantly lower density of crystal defects associated therewith.

A still further object of the present invention is to provide a method of fabricating a thin, high-quality SGOI substrate material that has a high degree of thickness uniformity.

A still further object of the present invention is to provide a method of fabricating a thin, high-quality SGOI substrate material which is capable of increasing the degree of lattice relaxation, minimizing surface artifacts, while substantially reducing the density of crystal defects present in the SGOI substrate material. None of the prior art methods are capable of achieving all three properties on SGOI substrates. Thus, the inventive method provides a significant and substantial advancement over the prior art.

An even further object of the present invention is to provide a method of fabricating a thin, high-quality SGOI substrate material which utilizes processing steps that are compatible with complementary metal oxide semiconductor (CMOS) processing steps.

An additional object of the present invention is to provide a method of fabricating a thin, high-quality, substantially relaxed SGOI substrate material which can be used as a lattice mismatch template, i.e., substrate, in forming strained Si layers.

A yet additional object of the present invention is to provide strained Si/substantially relaxed SGOI structures that have high carrier mobility which are useful in high-performance CMOS applications.

These and other objects and advantages are achieved in the present invention by utilizing a method wherein hydrogen ions (or any other ion that is capable forming defects that permit mechanical decoupling) are implanted at or near the interface between the first single crystal Si and the underlying barrier layer of a $Si_xGe_{1-x}$/SOI structure. The implanted ions are believed to assist in the mechanical decoupling of that interface thereby allowing an elastic relaxation mechanism to occur. Subsequent thermal processing diffusively mixes Ge within the $Si_xGe_{1-x}$/first single crystal Si bilayer. The Ge atoms during this diffusion are rejected from both the growing oxide (in the case of oxidation thinning) as well as the underlying barrier layer. Therefore, if the original bilayer is thinned by the thermal processing, the Ge content of the $Si_xGe_{1-x}$ layer will continue to increase. The lattice constant of the $Si_xGe_{1-x}$ alloy layer increases by about 4.17% in an approximately linear manner as the Ge fraction varies from 0 to 100 atomic percent. So as the Ge fraction increases, so must the physical dimension of the $Si_xGe_{1-x}$ layer to avoid the introduction of strain-relieving defects (plastic deformation). The ion implantation step of the present invention reduces defect production in strained bilayers by allowing elastic relaxation of the bilayer to occur by plastically deforming a very restricted region which is present at the bottom of the bilayer, i.e., at the first single crystal Si/Ge diffusion barrier layer interface. This region is subsequently reconstructed during the thermal processing step.

Specifically, the method of the present invention comprises the steps of:

forming a $Si_xGe_{1-x}$ layer, wherein x=0 or a number less than 1, on a surface of a first single crystal Si layer, said first single crystal Si layer has an interface with an underlying barrier layer that is resistant to Ge diffusion;

implanting ions that are capable of forming defects that permit mechanical decoupling at or near said interface into said layers;

heating said layers at a temperature which permits relaxation of strain within the layers and subsequent interdiffusion of Ge throughout the first single crystal Si layer and the $Si_xGe_{1-x}$ layer to form a substantially relaxed, single crystal SiGe layer atop the barrier layer.

It is noted that the substantially relaxed, single crystal SiGe layer formed in the present invention is comprised of a homogeneous mixture of the $Si_xGe_{1-x}$ layer as well as the first single crystal Si layer. Moreover, the substantially relaxed, single crystal SiGe layer has minimized surface defects and a reduced density of crystal defects as compared to relaxed SiGe layers that are formed without the implant step.

Following the above steps of ion implanting and heating, a strained Si layer may be grown epitaxially atop the substantially, relaxed single crystal SiGe layer to form a strained-Si/substantially relaxed SiGe-containing heterostructure that can be used in a variety of high-performance CMOS applications.

In some embodiments of the present invention, the first single crystal Si layer and the barrier layer are components of a silicon-on-insulator (SOI) substrate. In other embodiments, the barrier layer is formed atop a surface of a semiconductor substrate, and thereafter the first single crystal Si layer is formed atop the barrier layer. The latter substrate material is a non-SOI substrate.

In a highly preferred embodiment of the present invention, the first single crystal Si layer is a thin layer having a thickness of about 50 nm or less. The use of a thin starting single crystal layer is preferred because it permits the strained interface of the $Si_xGe_{1-x}$/first single crystal Si bilayer to be close to the decoupled Si/BOX interface.

The present method also contemplates the use of barrier layers that are unpatterned (i.e., barrier layers that are continuous) or patterned (i.e., discrete and isolated barrier regions or islands which are surrounded by semiconductor material).

In yet another embodiment of the present invention, a Si cap layer is formed atop the $Si_xGe_{1-x}$ alloy layer prior to heating the structure. This embodiment of the present invention provides thermodynamically stable (in terms of preventing defect production) thin, substantially relaxed SiGe-on-insulator, SGOI, substrate materials. It is noted that the term "thin" when used in conjunction with the high-quality, substantially relaxed SiGe-on-insulator substrate material, denotes that the homogenized SiGe layer formed via the inventive method has a thickness of about 2000 nm or less, with a thickness of from about 10 to about 200 nm being more highly preferred.

Another aspect of the present invention relates to the SiGe-on-insulator substrate material that is formed utilizing the above-mentioned processing steps. Specifically, the inventive substrate material comprises a Si-containing substrate; an insulating region that is resistant to Ge diffusion present atop the Si-containing substrate; and a substantially relaxed SiGe layer present atop the insulating region, wherein the substantially relaxed SiGe layer has a thickness of about 2000 nm or less, a measured relaxation value of about 30% or greater, substantially little or no surface defects, and a crystal defect density of about $5\times10^6/cm^2$ or less.

A yet further aspect of the present invention relates to a heterostructure which includes at least the above-mentioned substrate material. Specifically, the heterostructure of the present invention comprises a Si-containing substrate; an insulating region that is resistant to Ge diffusion present atop the Si-containing substrate; a substantially relaxed SiGe layer present atop the insulating region, wherein the substantially relaxed SiGe layer has a thickness of about 2000 nm or less, a measured relaxation value of about 30% or greater, substantially little or no surface defects, and a crystal defect density of about $5\times10^6/cm^2$ or less; and a strained Si layer formed atop the substantially relaxed SiGe layer.

Other aspects of the present invention relate to superlattice structures as well as templates for other lattice mismatched structures which include at least the SiGe-on-insulator substrate material of the present invention.

DETAILED DESCRIPTION OF THE INVENTION

Figure 1A:
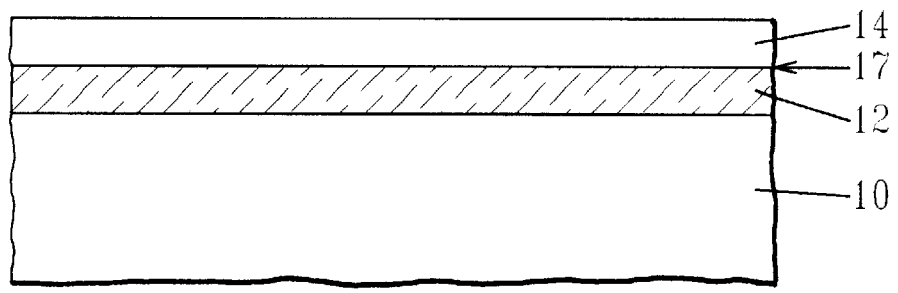
FIGS. 1A–1E are pictorial representations (through cross-sectional views) showing the basic processing steps that are employed in the present invention in fabricating the improved SGOI substrate material. In these figures, the initial substrate includes an unpatterned barrier layer.

The present invention, which provides a method of fabricating improved thin, high-quality, substantially relaxed SiGe-on-insulator substrate materials which can then serve as a lattice mismatched template for subsequent overgrowth of epitaxial Si, will now be described in greater detail by referring to the drawings that accompany the present application. It is noted that in the accompanying drawings like and/or corresponding elements are referred to by like reference numerals.

Figure 2A:
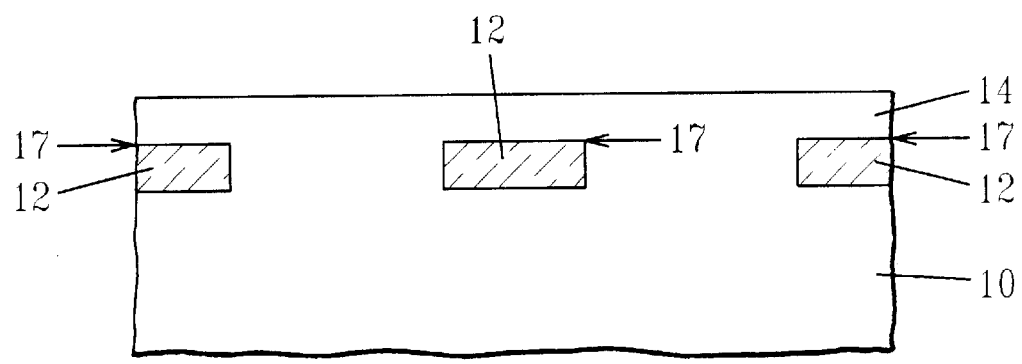
FIGS. 2A–2E are pictorial representations (through cross-sectional views) showing the basic processing steps that are employed in the present invention in fabricating the improved SGOI substrate material. In these figures, the initial substrate includes a patterned barrier layer.

Reference is first made to FIG. 1A and FIG. 2A which show initial substrate materials that can be employed in the present invention. Specifically, the initial substrate materials illustrated in FIGS. 1A and 2A each comprise Si-containing semiconductor substrate 10, barrier layer 12 which is resistant to Ge diffusion (hereinafter "barrier layer") present atop a surface of Si-containing semiconductor substrate 10 and first single crystal Si layer 14 having misfit and TD densities of less than about $1 \times 10^6$ defects/cm$^2$ present atop the barrier layer. The difference between the two initial structures depicted in the drawings is that, in FIG. 1A, the barrier layer is present continuously throughout the entire structure, whereas in FIG. 2A, the barrier layer is present as discrete and isolated regions or islands that are surrounded by semiconductor material, i.e., layers 10 and 14. Note that the initial structure shown in FIG. 1A thus includes an unpatterned barrier layer, whereas the initial structure of FIG. 2A includes a patterned barrier layer.

Notwithstanding whether the barrier layer is patterned or unpatterned, the initial structure may be a conventional silicon-on-insulator (SOI) substrate material wherein region 12 is a buried oxide (BOX) region which electrically isolates first single crystal Si layer 14 from Si-containing semiconductor substrate 10. The term "Si-containing" as used herein denotes a semiconductor substrate that includes at least silicon. Illustrative examples include, but are not limited to: Si, SiGe, SiC, SiGeC, Si/Si, Si/SiC, Si/SiGeC, and preformed silicon-on-insulators which may include any number of buried oxide (continuous, non-continuous or mixtures of continuous and non-continuous) regions present therein.

The SOI substrate may be formed utilizing conventional SIMOX (separation by ion implantation of oxygen) processes well-known to those skilled in the art, as well as the various SIMOX processes mentioned in co-assigned U.S. patent applications Ser. Nos. 09/861,593, filed May 21, 2001; Ser. No. 09/861,594, filed May 21, 2001; Ser. No. 09/861,590, filed May 21, 2001; Ser. No. 09/861,596, filed May 21, 2001; and Ser. No. 09/884,670, filed Jun. 19, 2001 as well as U.S. Pat. No. 5,930,634 to Sadana, et al., the entire contents of each are incorporated herein by reference. Note that the process disclosed in the '590 application can be employed herein to fabricate the patterned substrate shown in FIG. 2A.

Alternatively, the SOI substrate material may be made using other conventional processes including, for example, a thermal bonding and cutting process.

In addition to SOI substrates, the initial substrates shown in FIGS. 1A and 2A may be a non-SOI substrate which is made using conventional deposition processes as well as lithography and etching (employed when fabricating a patterned substrate). Specifically, when non-SOI substrates are employed, the initial structure is formed by depositing a Ge diffusion barrier layer atop a surface of a Si-containing substrate, via conventional deposition or thermal growing processes, optionally patterning the barrier layer by employing conventional lithography and etching; and thereafter forming a single crystal Si layer atop the barrier layer using conventional deposition processes including, for example, chemical vapor deposition (CVD), plasma-assisted CVD, sputtering, evaporation, chemical solution deposition or epitaxial Si growth.

Barrier layer 12 of the initial structure shown in FIGS. 1A and 2A comprises any insulating material which is highly resistant to Ge diffusion. Examples of such insulating and Ge diffusion resistant materials include, but are not limited to: crystalline or non-crystalline oxides or nitrides.

The thickness of the various layers of the initial structure may vary depending on the process used in making the same. Typically, however, single crystal Si layer 14 has a thickness of from about 1 to about 2000 nm, with a thickness of from about 20 to about 200 nm being more highly preferred. In the case of barrier layer 12 (i.e., Ge diffusion resistant layer), that layer may have a thickness of from about 1 to about 1000 nm, with a thickness of from about 20 to about 200 nm being more highly preferred. The thickness of the Si-containing substrate layer, i.e., layer 10, is inconsequential to the present invention. It is noted that the thicknesses provided above are exemplary and by no ways limit the scope of the present invention.

Although the present invention works using initial structures that have a single crystal Si layer having the above-mentioned thickness ranges, it is most preferably that the single crystal Si layer have a thickness of about 50 nm or less.

Figure 1B:
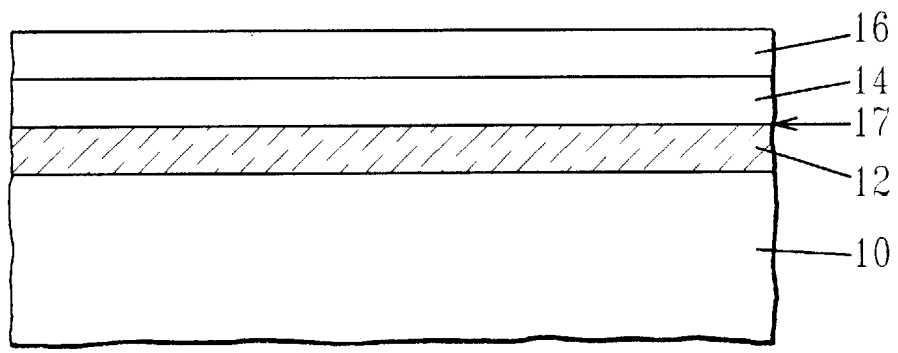
Figure 2B:
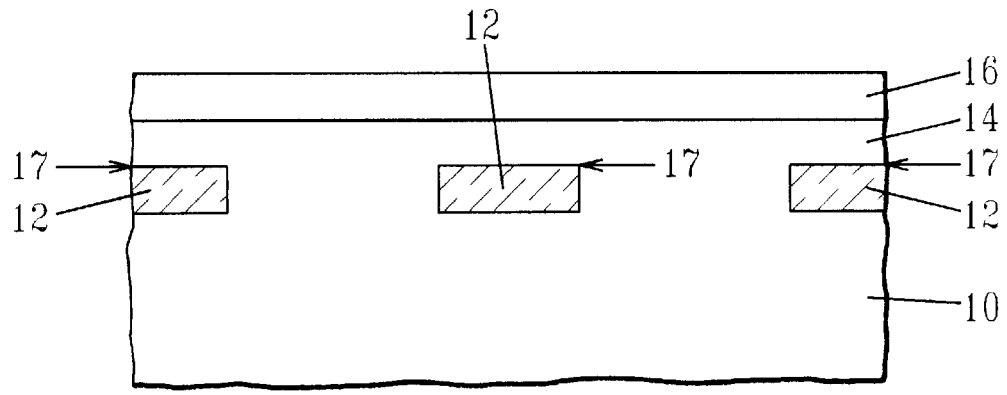

FIGS. 1B and 2B illustrate the structure that is formed after $Si_xGe_{1-x}$ layer 16 (wherein x is 0 or a number less than 1) is formed atop first single crystal Si layer 14. The "$Si_xGe_{1-x}$" layer is hereinafter referred to as a SiGe alloy layer. The SiGe alloy layer of the present invention may comprise SiGe alloys having up to 99.99 atomic percent Ge (when x is less than 1), as well as pure Ge (when x=0) that comprise 100 atomic percent Ge. In one embodiment of the present invention, it is preferred that the Ge content in the SiGe alloy layer be from about 0.1 to about 99.9 atomic percent, with a Ge atomic percent of from about 10 to about 35 being even more highly preferred. In the drawings, reference numeral 17 denotes the interface between barrier layer 12 and single crystal Si layer 14.

In accordance with the present invention, the SiGe alloy is formed atop first single crystal Si layer 14 using a conventional epitaxial growth method that is well-known to those skilled in the art which is capable of (i) growing a thermodynamically stable (below a critical thickness) SiGe alloy, or (ii) growing a SiGe alloy layer that is metastable and free from defects, i.e., misfit and TD dislocations. Illustrative examples of such epitaxial growing processes that are capable of satisfy conditions (i) or (ii) include, but are not limited to: low-pressure chemical vapor deposition (LPCVD), ultra-high vacuum chemical vapor deposition (UHVCVD), atmospheric pressure chemical vapor deposition (APCVD), molecular beam epitaxy (MBE) and plasma-enhanced chemical vapor deposition (PECVD).

The thickness of the SiGe alloy layer formed at this point of the present invention may vary, but typically layer 16 has a thickness of from about 10 to about 500 nm, with a thickness of from about 20 to about 200 nm being more highly preferred.

Figure 3A:
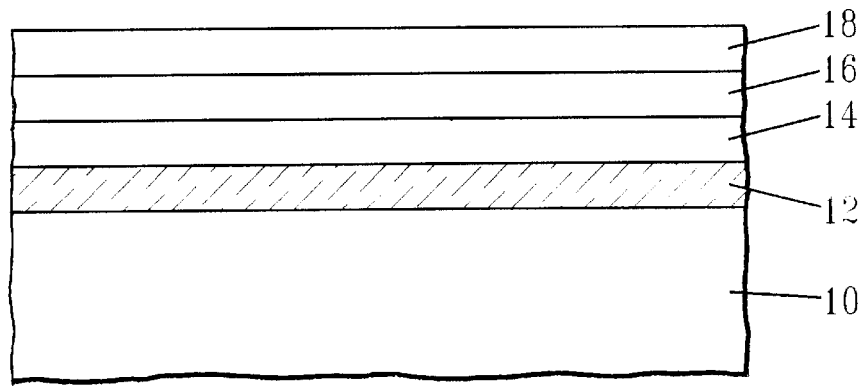
FIGS. 3A–3B are pictorial representations (through cross-sectional views) showing an alternative embodiment of the present invention wherein a Si cap layer is formed atop a SiGe alloy layer which is formed on an unpatterned (3A) or patterned (3B) substrate.
Figure 3B:
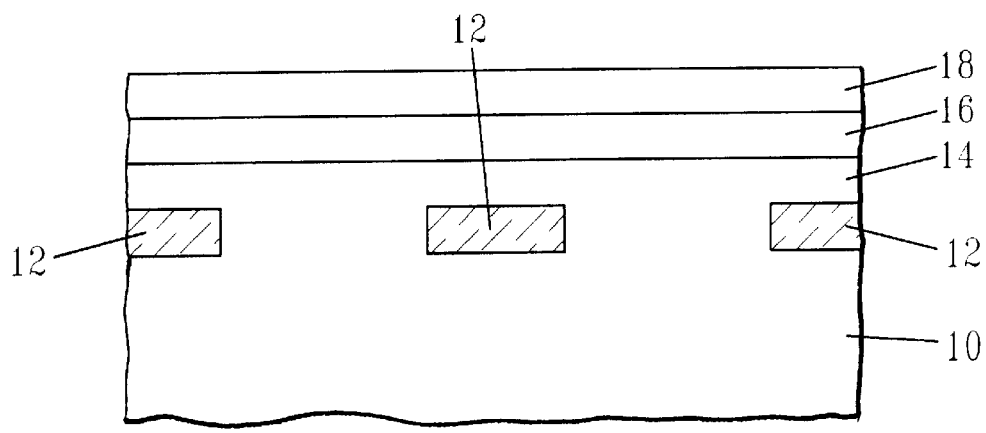

In one alternative embodiment of the present invention, see FIGS. 3A–3B, optional cap layer 18 is formed atop SiGe alloy layer 16 prior to performing the heating step of the present invention. More specifically, the optional cap layer may be formed prior to, or after, the implant step to be discussed in greater detail herein below. It is noted that although FIGS. 3A–3B show an embodiment where the optional cap layer is formed prior to ion implantation, the present invention also contemplates embodiments wherein the optional cap layer is formed after the ion implant step of the present invention. The optional cap layer employed in the present invention comprises any Si material including, but not limited to: epitaxial silicon (epi-Si), amorphous silicon (a:Si), single or polycrystalline Si or any combination thereof including multilayers. In a preferred embodiment, the cap layer is comprised of epi Si. It is noted that layers 16 and 18 may, or may not, be formed in the same reaction chamber.

When present, optional cap layer 18 has a thickness of from about 1 to about 100 nm, with a thickness of from about 1 to about 30 nm being more highly preferred. The optional cap layer is formed utilizing any well-known deposition process including the epitaxial growth processes mentioned above.

In one embodiment of the present invention, it is preferred to form a SiGe alloy (15 to 20 atomic percent Ge) layer having a thickness of from about 1 to about 2000 nm on the surface of a single crystal Si layer, and thereafter forming a Si cap layer having a thickness of from about 1 to about 100 nm atop the SiGe alloy layer.

Figure 1C:
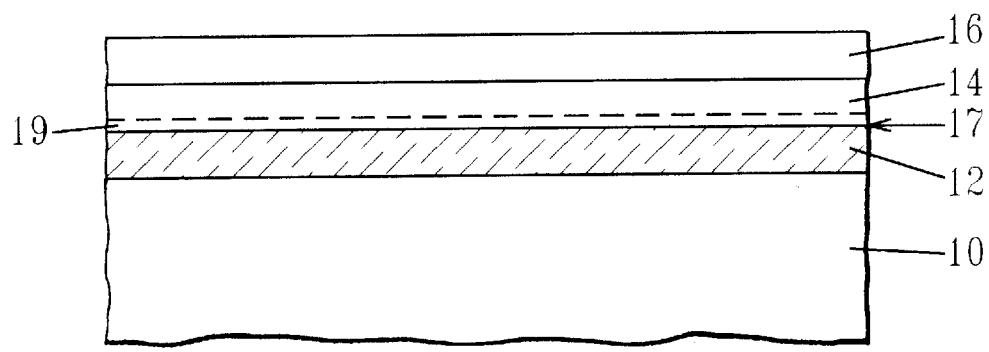
Figure 2C:
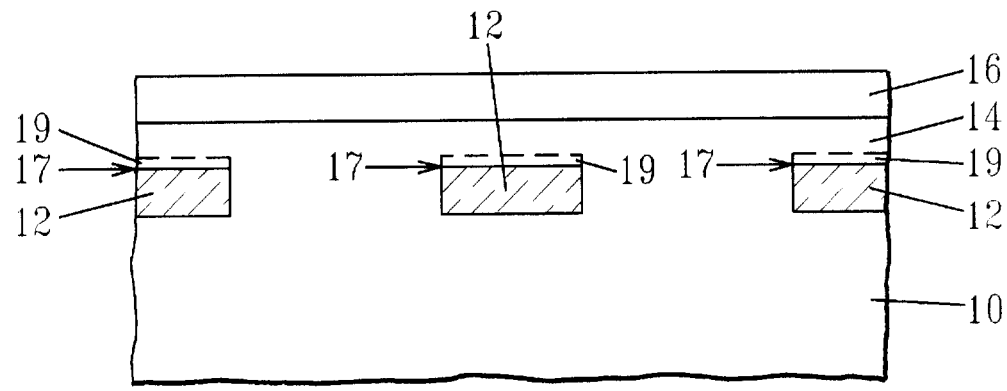

After forming the SiGe alloy (with or without the optional cap layer) atop the initial structure, the structure shown in either FIGS. 1B or 2B (with or without the optional cap) is then subjected to an ion implantation step wherein ions that are capable of forming defects that allow mechanical decoupling at or near interface 17 is performed. Examples of such defects that permit mechanical decoupling to occur include: platelet defects or bubble-like defects, as in the case for hydrogen ion implantation. The implant may be performed with or without the use of an implantation mask. The structure after this implantation step is shown in FIGS. 1C or 2C. In these figures, reference numeral 19 denotes the defect regions formed by the ion implantation step. As mentioned above, the defect regions solve the problem of defect production in the SiGe alloy/single crystal Si bilayer by allowing elastic relaxation of the bilayer to occur. Specifically, elastic relaxation occurs by plastically deforming the defect region which is present at or near interface 17.

The defects which permit mechanical decoupling to occur at or near interface 17 are formed by implanting ions such as hydrogen, deuterium, helium, oxygen, neon, and mixtures thereof into the various layers using implant conditions which maintain the peak of the ion range at or near interface 17. Preferred ions used in the present invention are hydrogen ions ($H^+$). It is noted that other species of hydrogen such as $H_2^+$ can also contemplated herein.

The implant step of the present invention is conducted at approximately room temperature, i.e., a temperature of from about 283K. to about 303K., using a beam current density of from about 0.01 to about 10 microamps/cm$^2$. Implantation at different temperatures and/or using other beam current densities may affect mechanical decoupling.

The concentration of the implant species used in forming the platelet defects may vary depending upon the type of implant species employed. Typically, however, the concentration of implanting ions used at this point of the present invention is below 3E16 cm$^{-2}$, with an ion concentration of from about 1E16 to about 2.99E16 cm$^{-2}$ being more highly preferred. The energy of this implant may also vary depending upon the type of ion that is being implanted, with the proviso that the implant energy must be capable of positioning ions at or near interface 17. For example, when hydrogen is employed as the implant ion, the energy used to ensure platelet formation at or near interface 17 is from about 1 to about 100 keV, with an energy of from about 3 to about 20 keV being more highly preferred.

Figure 1D:
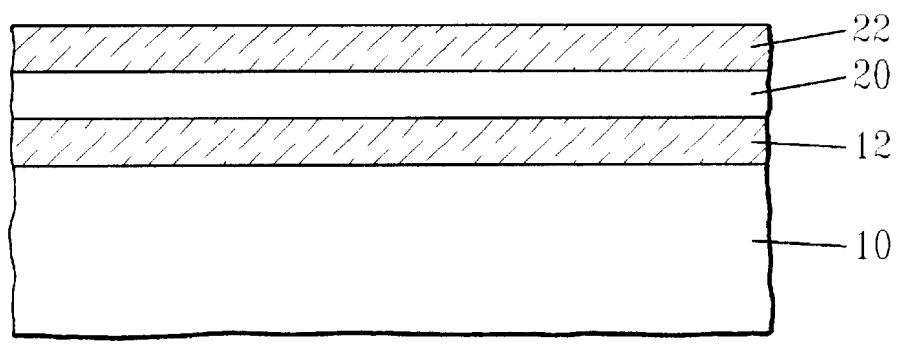
Figure 2D:
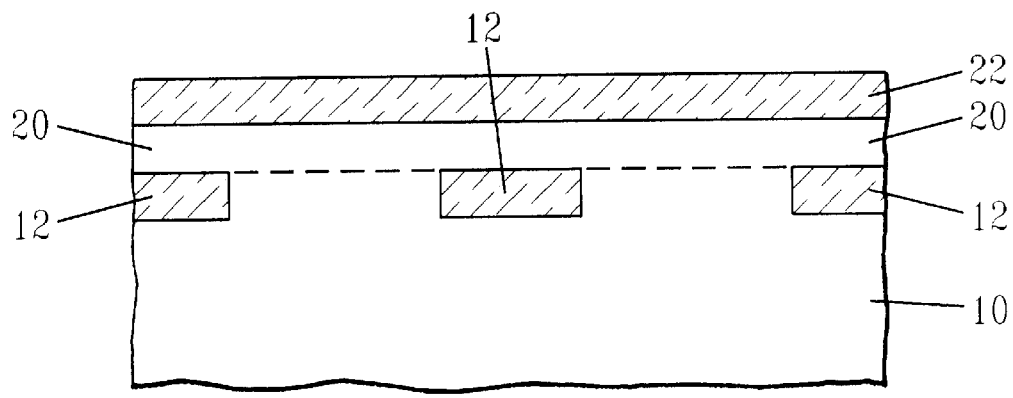

After the implant step, and if not previously formed on the structure, the optional cap may be formed atop the SiGe alloy layer. Next, the implanted structure is heated, i.e., annealed, at a temperature which permits relaxation of the strained SiGe alloy later and subsequent interdiffusion of Ge throughout first single crystal Si layer 14, SiGe alloy layer 16 and, if present, the optional Si cap thereby forming substantially relaxed, single crystal SiGe layer 20 atop the barrier layer (See FIGS. 1D or 2D). The relaxation anneal may be performed separately from the interdiffusion anneal or combined in one annealing process. The heating can be performed in a tube furnace or using rapid-thermal annealing (RTA) tools. Note that oxide layer 22 is formed atop layer 20 during the heating step. This oxide layer is typically, but not always, removed from the structure after the heating step using a conventional wet etch process wherein a chemical etchant such as HF that has a high selectivity for removing oxide as compared to SiGe is employed. Alternatively, this oxide layer may be removed using a conventional dry etching process such as reactive-ion etching.

Note that when the oxide layer is removed, a second single crystal Si layer can be formed atop layer 20 and the above processing steps of the present invention may be repeated any number of times to produce a multilayered relaxed SiGe substrate material.

The oxide layer formed after the heating step of the present invention has a variable thickness which may range from about 20 to about 2000 nm, with a thickness of from about 20 to about 500 nm being more highly preferred.

Specifically, the heating step of the present invention is an annealing step which is performed at a temperature of from about 900° to about 1350° C., with a temperature of from about 1200° to about 1335° C. being more highly preferred. Moreover, the heating step of the present invention is carried out in an oxidizing ambient which includes at least one oxygen-containing gas such as $O_2$, NO, $N_2O$, $H_2O$ (steam), ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The heating step may be carried out for a variable period of time which typically ranges from about 10 to about 1800 minutes, with a time period of from about 60 to about 600 minutes being more highly preferred. The heating step may be carried out at a single targeted temperature, or various ramp and soak cycles using various ramp rates and soak times can be employed.

The heating step is performed under an oxidizing ambient to achieve the presence of a surface oxide layer, i.e., layer 22, which acts as a diffusion barrier to Ge atoms. Therefore, once the oxide layer is formed on the surface of the structure, Ge becomes trapped between barrier layer 12 and oxide layer 22. As the surface oxide increases in thickness, the Ge becomes more uniformly distributed throughout layers 14, 16, and optionally 18, but it is continually and efficiently rejected from the encroaching oxide layer. So as the (now homogenized) layers are thinned during this heating step, the relative Ge fraction increases. Efficient thermal mixing is achieved in the present invention when the heating step is carried out at a temperature of from about 1200° to about 1320° C. in a diluted oxygen-containing gas.

It is also contemplated herein to use a tailored heat cycle which is based upon the melting point of the SiGe alloy layer. In such an instance, the temperature is adjusted to tract below the melting point of the SiGe alloy layer.

Note that if the oxidation occurs too rapidly, Ge cannot diffuse away from the surface oxide/SiGe interface fast enough and is either transported through the oxide (and lost) or the interfacial concentration of Ge becomes so high that the alloy melting temperature will be reached.

The role of the heating step of the present invention is (1) to allow Ge atoms to diffuse more quickly thereby maintaining a homogeneous distribution during annealing; and (2) to subject the ('initially') strained layer structure to a thermal budget which will facilitate an equilibrium configuration. After this heating step has been performed, the structure includes a uniform and substantially relaxed SiGe alloy layer, i.e., layer 20, sandwiched between barrier layer 12 and surface oxide layer 22.

In accordance with the present invention, relaxed SiGe layer 20 has a thickness of about 2000 nm or less, with a thickness of from about 10 to about 100 nm being more highly preferred. Note that the relaxed SiGe layer formed in the present invention is thinner than prior art SiGe buffer layers and has a defect density including misfits and TDs, of about $5 \times 10^6$ defects/cm$^2$ or less.

The relaxed SiGe layer formed in the present invention has a final Ge content of from about 0.1 to about 99.9 atomic percent, with an atomic percent of Ge of from about 10 to about 35 being more highly preferred. Another characteristic feature of relaxed SiGe layer 22 is that it has a measured lattice relaxation of from about 30% or greater, with a measured lattice relaxation of from about 50 to about 70% being more typically preferred. It is noted that 100% relaxation is most preferred in the present invention.

It is noted that the measured relaxation value of the SGOI substrate materials formed utilizing the present invention are substantially higher than the measured relaxation values typically reported for prior art SGOI substrate materials that are formed without ion implantation. Additionally, the inventive method provides minimized surface artifacts, while substantially reducing the density of crystal defects. All three of the aforementioned properties are not obtainable on SGOI using prior art methods that do not include the inventive ion implantation step described above.

Figure 1E:
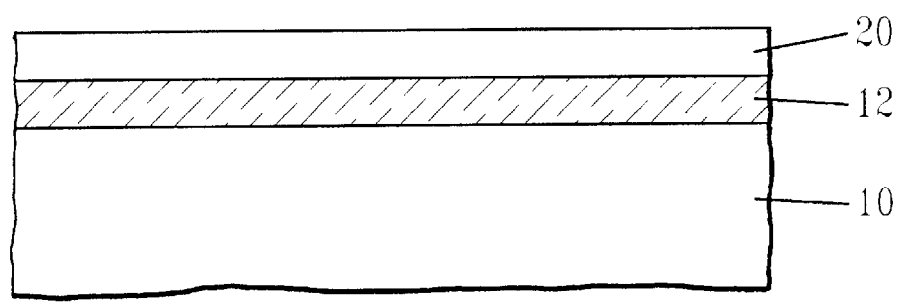
Figure 2E:
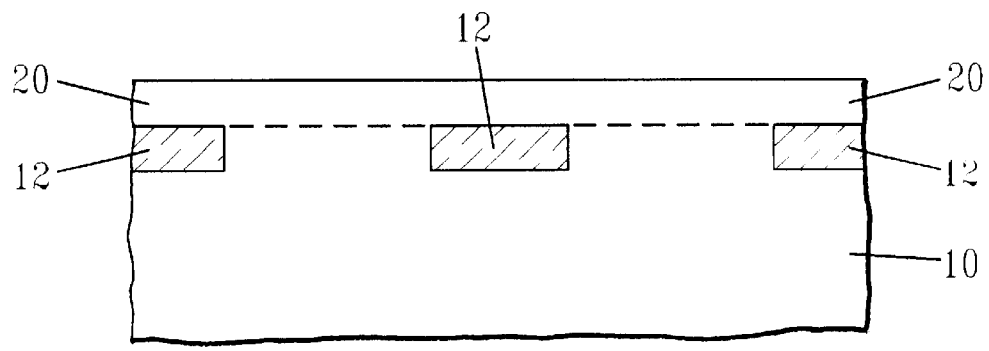

As stated above, surface oxide layer 22 may be stripped at this point of the present invention so as to provide the SiGe-on-insulator substrate material shown, for example, in FIGS. 1E or 2E (note that the substrate material does not include the cap layer since that layer has been used in forming the relaxed SiGe layer).

In some embodiments of the present invention, a Si layer may be formed atop SiGe layer 20 shown in FIGS. 1E and 2E, respectively. The Si layer is formed using a conventional epitaxial deposition process well known in the art. The thickness of the epi-Si layer may vary, but typically, the epi-Si layer has a thickness of from about 1 to about 100 nm, with a thickness of from about 1 to about 30 nm being more highly preferred. In some instances, additional SiGe can be formed atop relaxed SiGe layer 20 utilizing the above-mentioned processing steps, and thereafter an epi-Si may be formed. Because layer 20 has a large in-plane lattice parameter as compared to the epi-Si layer, the epi-Si layer will be strained in a tensile manner.

As stated above, the present invention also contemplates superlattice structures as well as lattice mismatched structures which include at least the SiGe-on-insulator substrate material of the present invention. In the case of superlattice structures, such structures would include at least the substantially relaxed SiGe-on-insulator substrate material of the present invention, and alternating layers Si and SiGe formed atop the substantially relaxed SiGe layer of the substrate material.

In the case of lattice mismatched structures, GaAs, GaP or other like III/V compound semiconductors would be formed atop the substantially relaxed SiGe layer of the inventive SiGe-on-insulator substrate material.

The following example is given to illustrate some of the advantages that can be achieved utilizing the method of the present invention compared with a prior art diffusion method wherein no ion implantation step is used in forming a relaxed SGOI substrate material.

EXAMPLE

In this example, a relaxed SGOI substrate material was prepared utilizing the method of the present invention and compared with a prior art relaxed SGOI substrate material that was prepared without the inventive ion implantation step.

The initial structure used in forming each of the relaxed SGOI substrate materials include the following layers (top-down):

SiGe (600 Å, 20 atomic % Ge)/Si (350 Å)/barrier oxide (1350 Å)/Si substrate (750 µm).

To one of the initial structures containing the above top-down configuration, hydrogen ions were implanted into the structure at or near the interface between the barrier oxide and the 350 Å Si layer using an ion dose of about 2.5E16 H/cm$^2$. The implant was carried out at an energy of about 6.7 keV. The other structure was not subjected to this implant step.

Both structures were then annealed in oxygen using the following heating procedure: ramp from room temperature to 1200° C. at a ramp rate of 3° C./min and hold at 1200° C. until a homogeneous 350 Å SiGe layer was formed atop the barrier oxide.

Figure 4:
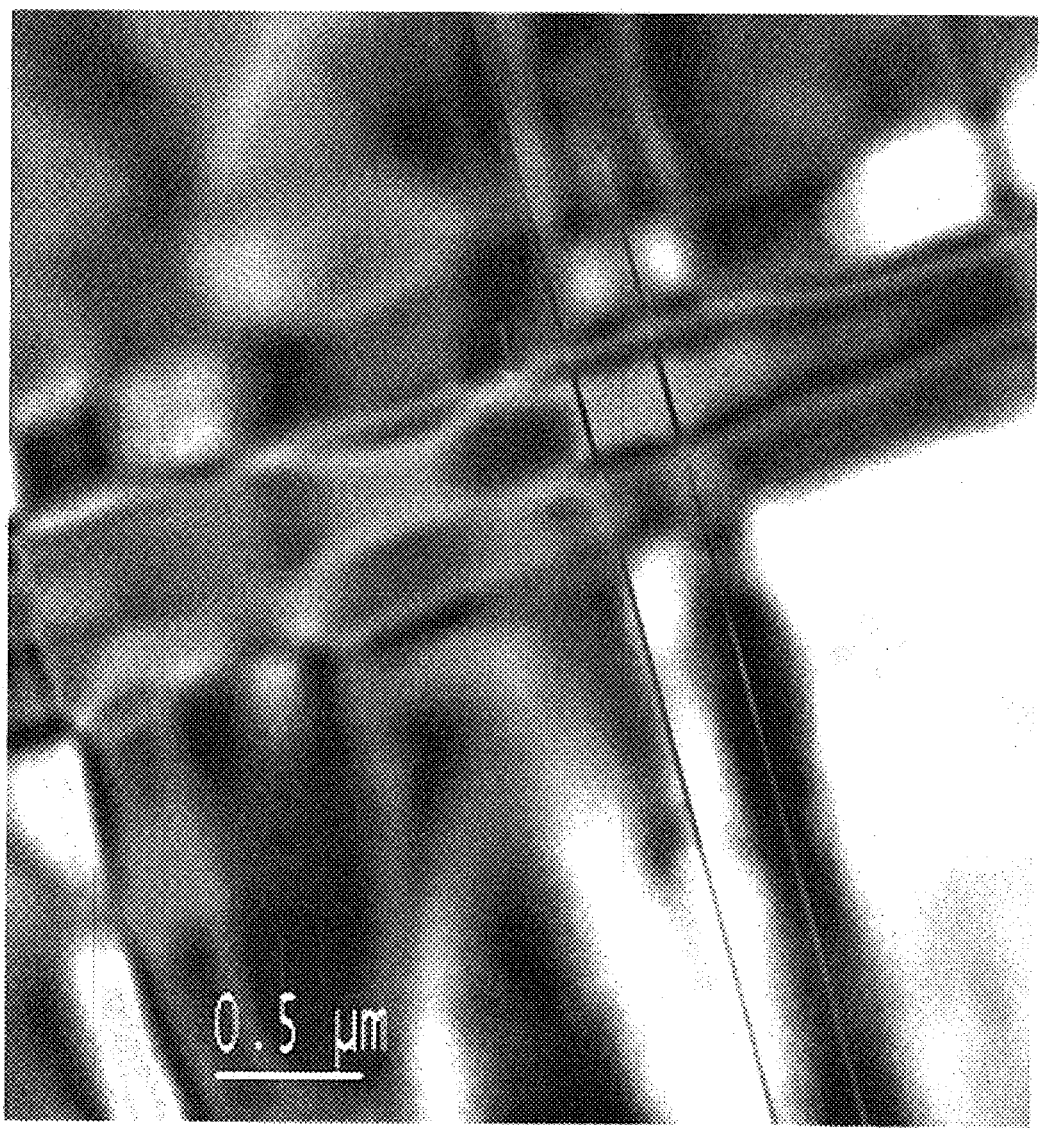
FIG. 4 is a plan view TEM (transmission electron micrograph) of a controlled SGOI substrate material.
Figure 5:
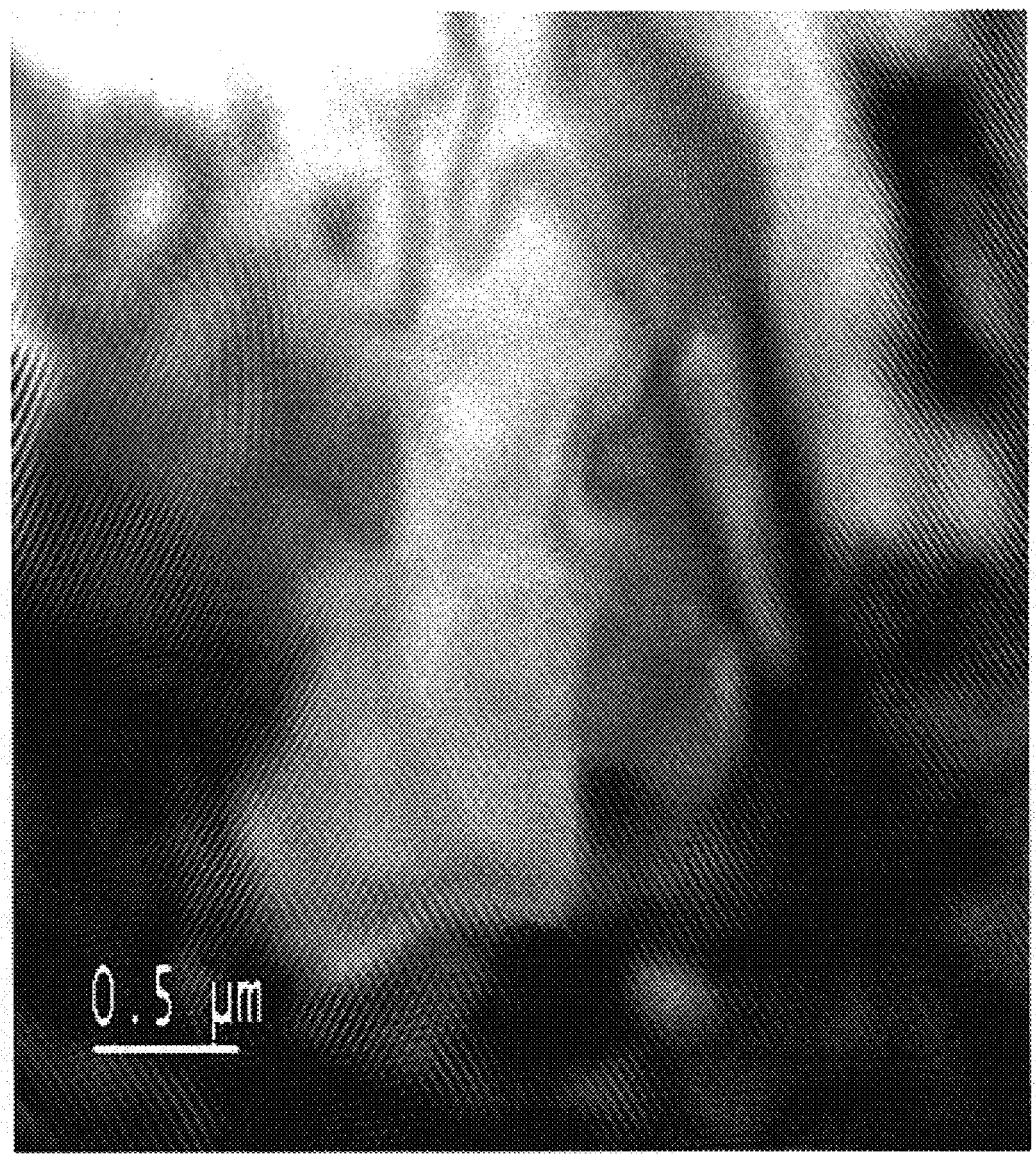
FIG. 5 is a plan view TEM of an inventive SGOI substrate material.

FIG. 4 is a plan-view TEM image of the final SGOI fabricated without the use of implantation. The image shows an extended defect as well as thickness contrast lines due to persisting surface artifacts. FIG. 5 shows the same plan-view TEM image for the structure which received the hydrogen implant. There is a substantial reduction of crystal defects as well as artifacts due to surface defects. The fine visible lines in the image are Moiré interference fringes and result from the difference in the lattice parameter of the (relaxed) SiGe alloy layer and the underlying Si substrate (below the buried oxide layer).

These data show that the inventive SGOI substrate material, particularly the homogeneous SiGe layer (formed by ion implantation and annealing) has enhanced relaxation, significantly lower defect density and improved surface quality compared to the prior art SGOI substrate material.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method for fabricating a SiGe-on-insulator substrate material comprising the steps of:

forming a $Si_xGe_{1-x}$ layer, wherein x=0 or a number less than 1, on a surface of a first single crystal Si layer, said first single crystal Si layer has an interface with an underlying barrier layer that is resistant to Ge diffusion;

implanting ions that are capable of forming defects that allow mechanical decoupling at or near said interface into said layers; and heating said layers at a temperature which permits relaxation of strain within the layers and subsequent interdiffusion of Ge throughout the first single crystal Si layer and the $Si_xGe_{1-x}$ layer to form a substantially relaxed, single crystal SiGe layer atop the barrier layer.

2. The method of claim 1 wherein said barrier layer is a patterned barrier layer.

3. The method of claim 1 wherein said barrier layer is an unpatterned barrier layer.

4. The method of claim 1 wherein said barrier layer comprises crystalline or non-crystalline oxides, or crystalline or non-crystalline nitrides.

5. The method of claim 1 wherein said barrier layer is a buried oxide region that is patterned or unpatterned.

6. The method of claim 1 wherein said $Si_xGe_{1-x}$ layer is formed by an epitaxial growth process selected from the group consisting of low-pressure chemical vapor deposition, atmospheric pressure chemical vapor deposition, ultra-high vacuum chemical vapor deposition, molecular beam epitaxy, and plasma-enhanced chemical vapor deposition.

7. The method of claim 1 further comprising forming a Si cap layer atop said $Si_xGe_{1-x}$ layer prior to performing the heating step.

8. The method of claim 7 wherein said Si cap layer comprises epi-Si, a:Si, single or polycrystalline Si or any combination and multilayer thereof.

9. The method of claim 1 wherein said implanting ions comprise hydrogen, deuterium, helium, oxygen, neon or mixtures thereof.

10. The method of claim 1 wherein said implanting ions are hydrogen ions.

11. The method of claim 1 wherein said implanting is performed using an ion concentration of below 3E16 atoms/$cm^2$.

12. The method of claim 10 wherein said hydrogen ions are implanted at an energy of from about 1 to about 100 keV.

13. The method of claim 1 wherein a surface oxide layer forms during said heating step.

14. The method of claim 13 further comprising removing said surface oxide layer utilizing a wet chemical etch process or dry etching.

15. The method of claim 1 wherein said forming, implanting and heating steps are repeated any number of times.

16. The method of claim 1 wherein said heating step is carried out in an oxidizing ambient which comprises at least one oxygen-containing gas.

17. The method of claim 16 wherein said at least one oxygen-containing gas comprises $O_2$, NO, $N_2O$, steam, ozone, air or mixtures thereof.

18. The method of claim 17 further comprising an inert gas, said inert gas being employed to dilute said at least one oxygen-containing gas.

19. The method of claim 1 wherein said heating step is performed at a temperature of from about 900° to about 1350° C.

20. The method of claim 19 wherein said heating step is performed at a temperature of from about 1200° to about 1335° C.

21. The method of claim 1 wherein said substantially relaxed SiGe layer has a thickness of about 2000 nm or less.

22. The method of claim 1 wherein said substantially relaxed SiGe layer has a defect density of about $5 \times 10^6$ or less.

23. The method of claim 1 wherein said substantially relaxed SiGe layer has a measured relaxation value of about 30% or greater.

24. The method of claim 1 further comprising growing an additional SiGe layer atop said substantially relaxed SiGe layer.

25. The method of claim 24 further comprising forming a strained Si layer atop said additional SiGe layer.

26. The method of claim 1 further comprising forming a strained Si layer atop said substantially relaxed SiGe layer.

27. The method of claim 1 wherein said first single crystal Si layer has a thickness of about 50 nm or less.

28. The method of claim 1 wherein said heating step includes a separate relaxation anneal and a separate interdiffusion anneal.

29. The method of claim 1 wherein said implant is performed at a temperature of from about 283K. to about 303K. using a beam current density of about 0.01 to about 10 microamps/$cm^2$.

* * * * *

UNITED STATES PATENT AND TRADEMARK OFFICE
CERTIFICATE OF CORRECTION

PATENT NO. : 6,841,457 B2
DATED : January 11, 2005
INVENTOR(S) : Stephen W. Bedell It is certified that error appears in the above-identified patent and that said Letters Patent is hereby corrected as shown below:

Column 10,
Lines 47-57, should read:
-- FIG 4 is representative of the prior art relaxed SGOI substrate material, while FIG 5 is representative of the inventive relaxed SGOI material. The X-ray diffraction data showing the Ge fraction of the final SiGe alloy, as well as the final degree of relaxation for the structure that received implantation is as follows: Ge fraction 0.257; relaxation fraction 0.52. TheX-ray data for the structure that received no implantation is as follows: Ge fraction 0.265; relaxation fraction 0.38. --

Signed and Sealed this

Seventh Day of June, 2005

JON W. DUDAS
*Director of the United States Patent and Trademark Office*